US010281335B2

(12) United States Patent
Howells

(10) Patent No.: US 10,281,335 B2
(45) Date of Patent: May 7, 2019

(54) PULSED RADIATION SOURCES FOR TRANSMISSION PYROMETRY

(71) Applicant: Applied Materials, Inc., Santa Clara, CA (US)

(72) Inventor: Samuel C. Howells, Portland, OR (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 54 days.

(21) Appl. No.: 15/656,662

(22) Filed: Jul. 21, 2017

(65) Prior Publication Data

US 2018/0340835 A1 Nov. 29, 2018

Related U.S. Application Data

(60) Provisional application No. 62/511,631, filed on May 26, 2017.

(51) Int. Cl.
*G01J 5/08* (2006.01)
*G01J 5/20* (2006.01)
*H05B 3/00* (2006.01)
*H01L 21/67* (2006.01)
*H01L 33/00* (2010.01)

(52) U.S. Cl.
CPC ............... *G01J 5/20* (2013.01); *G01J 5/0821* (2013.01); *G01J 5/0896* (2013.01); *H01L 21/67115* (2013.01); *H01L 21/67248* (2013.01); *H05B 3/0047* (2013.01); *H01L 33/0045* (2013.01)

(58) Field of Classification Search
None
See application file for complete search history.

(56) References Cited

U.S. PATENT DOCUMENTS 4,879,723 A * 11/1989 Dixon ............... H01S 3/108
372/21
4,891,499 A 1/1990 Moslehi
6,805,466 B1 10/2004 Ranish
7,112,763 B2 9/2006 Hunter et al.
(Continued)

FOREIGN PATENT DOCUMENTS

JP    2008182228 A   8/2008
WO   2017019384 A1  2/2017

OTHER PUBLICATIONS

International Search Report and Written Opinion dated Sep. 11, 2018 for Application No. PCT/US2018/030238.

*Primary Examiner* — Edwin C Gunberg
(74) *Attorney, Agent, or Firm* — Patterson + Sheridan LLP

(57) ABSTRACT

Examples described herein generally relate to apparatus and methods for rapid thermal processing (RTP) of a substrate. The present disclosure discloses pulsed radiation sources, used to measure a broad range of low to high temperatures in the RTP chamber. In one example, two or more lasers, one of which emits pulses of radiation at 1,030 nm and one of which emits pulses of radiation at 1,080 nm, which measures temperatures below about 200° C., are used. In another example, two or more LEDs, one of which emits pulses of radiation at 1,030 nm and one of which emits pulses of radiation at 1,080 nm, are used. In yet another example, a broadband radiation source is used to emit pulses of radiation at least at 1,030 nm and 1,080 nm. These radiation sources are useful for detection of a broad range of low to high temperatures in the RTP chamber.

15 Claims, 6 Drawing Sheets

(56) References Cited

U.S. PATENT DOCUMENTS

| | | |
|---|---|---|
| 7,398,693 B2 | 7/2008 | Ranish et al. |
| 7,860,379 B2 | 12/2010 | Hunter et al. |
| 8,222,574 B2 | 7/2012 | Sorabji et al. |
| 8,254,767 B2 | 8/2012 | Hunter et al. |
| 8,283,607 B2 | 10/2012 | Ranish et al. |
| 8,294,068 B2 | 10/2012 | Ranish et al. |
| 8,367,983 B2 | 2/2013 | Ranish et al. |
| 8,548,311 B2 | 10/2013 | Koelmel et al. |
| 9,270,075 B2* | 2/2016 | Leproux ............ H01S 3/06758 |
| 2008/0171417 A1 | 7/2008 | Ramachandran et al. |
| 2009/0008742 A1 | 1/2009 | Okayama |
| 2010/0054720 A1* | 3/2010 | Hunter ............. H01L 21/67115 |
| | | 392/416 |
| 2014/0192839 A1 | 7/2014 | Lacroix |
| 2014/0330422 A1 | 11/2014 | Ranish |
| 2015/0357215 A1 | 12/2015 | Moffatt et al. |

* cited by examiner

PULSED RADIATION SOURCES FOR TRANSMISSION PYROMETRY

CROSS-REFERENCE TO RELATED APPLICATIONS

This application claims benefit of U.S. Provisional Patent Application Ser. No. 62/511,631, filed on May 26, 2017, which is herein incorporated by reference in its entirety.

BACKGROUND

Field

Embodiments described herein relate to apparatus and methods of annealing substrates. More specifically, apparatus and methods described herein relate to temperature measurement of a substrate by radiation transmission.

Description of the Related Art

Transmission pyrometry is a common mode of assessing the thermal state of a substrate (e.g., a silicon substrate). Thermal processing chambers commonly expose a substrate to intense, non-coherent or coherent radiation to raise the temperature of the substrate, either of the whole substrate or a part or surface area of the substrate. The radiation used to heat the substrate can create a strong background radiation environment in the chamber.

Radiation is used in transmission pyrometry applications to assess the thermal state of the substrate because the radiation having different wavelengths can be differentiated from the background radiation in the chamber. Lasers are typically used because they afford the opportunity to select a particular wavelength best suited to the substrate. Lasers produce coherent radiation that, when transmitted through a substrate, can indicate a thermal state of the substrate, which may be registered as a temperature. The transmitted radiation may be detected by a pyrometer, compared to the source radiation, and the result is correlated to infer the substrate thermal state. Heretofore, the source radiation was generally not pulsed and selected to be at a small number (e.g., one or two) of specific, narrow wavelength bands. The transmitted radiation, likewise, was analyzed only at a small number (e.g., one or two) of specific, narrow wavelength bands.

However, thermal noise, or electrical fluctuations arising from random thermal motion of electrons, from chamber thermal sources and substrate emissions can reduce accuracy and precision of conventional transmission pyrometry methods using high-resistivity substrates, since the thermal noise is close to the optimum transmission bands for silicon (Si). Additionally, current transmission pyromtery apparatus and methods do not measure a broad range of low to high temperatures.

Therefore, there is a need for improved apparatuses for reliable transmission pyrometric measurements of low to high temperatures.

SUMMARY

Examples described herein generally relate to apparatus and methods for rapid thermal processing (RTP) of a substrate. The present disclosure discloses pulsed radiation sources used to measure a broad range of low to high temperatures in the RTP chamber. In one example, two or more lasers, one of which emits pulses of radiation at 1,030 nm and one of which emits pulses of radiation at 1,080 nm, which measures temperatures below about 200° C., are used. In another example, two or more LEDs, one of which emits pulses of radiation at 1,030 nm and one of which emits pulses of radiation at 1,080 nm, are used. In yet another example, a broadband radiation source is used to emit pulses of radiation at least at 1,030 nm and 1,080 nm. These radiation sources are useful for detection of a broad range of low to high temperatures in the RTP chamber.

In one example, a thermal processing chamber is disclosed. The thermal processing chamber includes a chamber body, a lamp assembly coupled to the chamber body, a substrate support assembly coupled to the chamber body opposite the lamp assembly, the substrate support assembly defining a processing plane, a pulsed radiation source coupled to the lamp assembly, the pulsed radiation source comprising a first laser operable to emit radiation at a first wavelength and a second laser operable to emit radiation at a second wavelength, a source manifold that couples the radiation source to the lamp assembly, and a radiation detector optically coupled to the pulsed radiation source and disposed opposite from the pulsed radiation source across the processing plane.

In another example, a thermal processing chamber is disclosed. The thermal processing chamber includes a chamber body, a lamp assembly coupled to the chamber body, a substrate support assembly coupled to the chamber body opposite the lamp assembly, the substrate support assembly defining a processing plane, a pulsed radiation source coupled to the lamp assembly, the pulsed radiation source comprising a first superluminescent diode operable to emit radiation at a first wavelength and a second superluminescent diode operable to emit radiation at a second wavelength, a source manifold that couples the radiation source to the lamp assembly, and a radiation detector optically coupled to the pulsed radiation source and disposed opposite from the pulsed radiation source across the processing plane.

In yet another example, a thermal processing chamber is disclosed. The thermal processing chamber includes a chamber body, a lamp assembly coupled to the chamber body, a substrate support assembly coupled to the chamber body opposite the lamp assembly, the substrate support assembly defining a processing plane, a pulsed radiation source coupled to the lamp assembly, the pulsed radiation source comprising at least one broadband source operable to emit radiation at least at a first wavelength and a second wavelength, a source manifold that couples the pulsed radiation source to the lamp assembly, and a radiation detector optically coupled to the radiation source and disposed opposite from the pulsed radiation source across the processing plane.

In yet another example, a method is disclosed. The method includes pulsing a first beam having a first wavelength from a radiation source onto a substrate disposed in a process chamber, pulsing a second beam having a second wavelength from the radiation source onto the substrate, emitting radiation onto the substrate from a plurality of lamps, and measuring a temperature of the substrate by detecting, using one or more detectors, radiation transmitted by the substrate at the first and second wavelengths.

BRIEF DESCRIPTION OF THE DRAWINGS

So that the manner in which the above recited features of the present disclosure can be understood in detail, a more particular description of the disclosure, briefly summarized above, may be had by reference to examples, some of which are illustrated in the appended drawings. It is to be noted, however, that the appended drawings illustrate only typical examples of this disclosure and are therefore not to be considered limiting of its scope, for the disclosure may admit to other equally effective examples.

To facilitate understanding, identical reference numerals have been used, wherever possible, to designate identical elements that are common to the Figures. Additionally, elements of one example may be advantageously adapted for utilization in other examples described herein.

DETAILED DESCRIPTION

Examples described herein generally relate to apparatus and methods for rapid thermal processing (RTP) of a substrate. The present disclosure discloses pulsed radiation sources used to measure a broad range of low to high temperatures in the RTP chamber. In one example, two or more lasers, one of which emits pulses of radiation at 1,030 nm and one of which emits pulses of radiation at 1,080 nm, which measures temperatures below about 200° C., are used. In another example, two or more LEDs, one of which emits pulses of radiation at 1,030 nm and one of which emits pulses of radiation at 1,080 nm, are used. In yet another example, a broadband radiation source is used to emit pulses of radiation at least at 1,030 nm and 1,080 nm. These radiation sources are useful for detection of a broad range of low to high temperatures in the RTP chamber.

Figure 1:
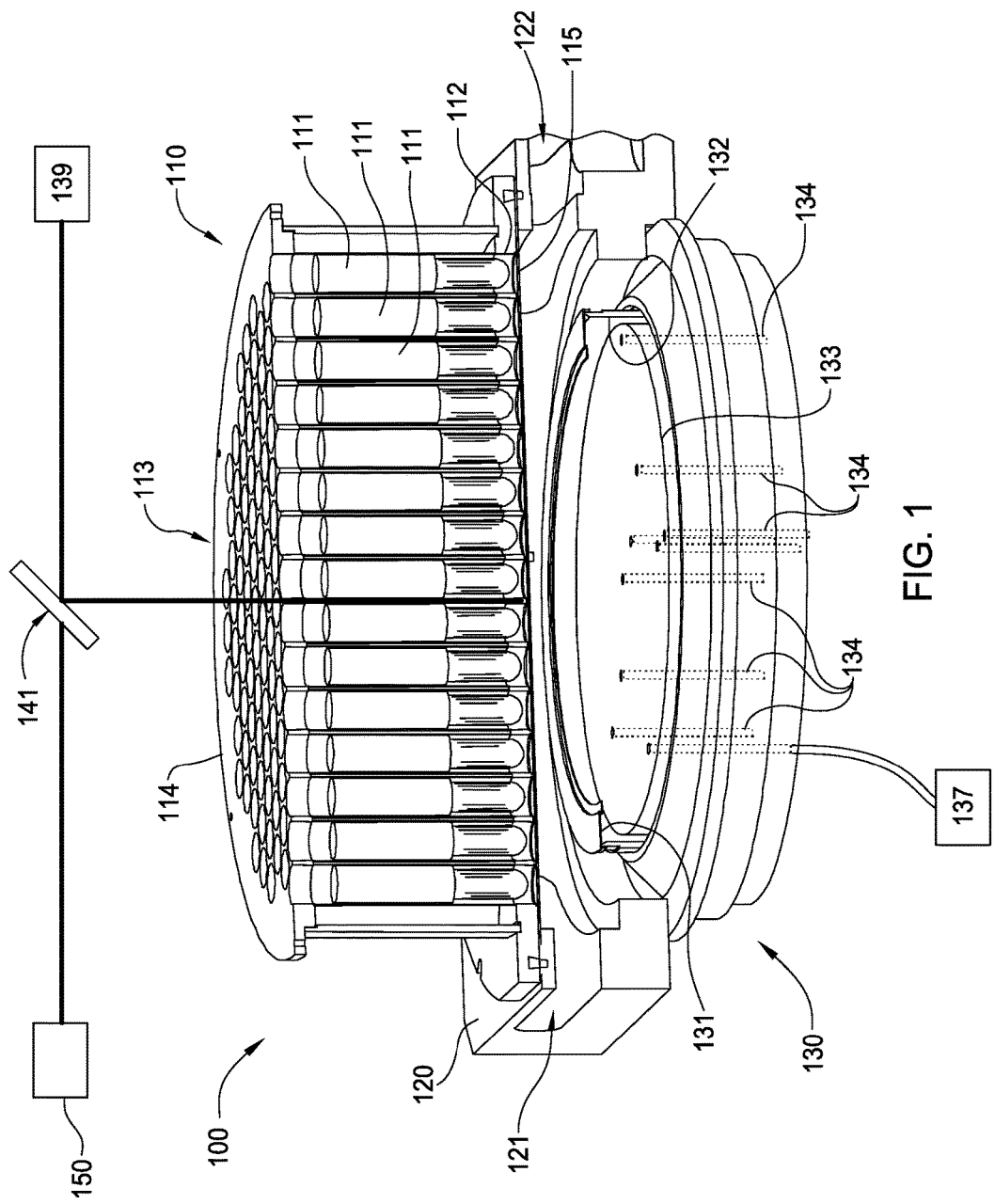
FIG. 1 is a partial perspective diagram of a rapid thermal processing (RTP) chamber according to examples of the present disclosure.

FIG. 1 is a partial perspective diagram of a rapid thermal processing (RTP) chamber 100 according to examples of the present disclosure. The chamber 100 generally consists of a lamp assembly 110, a chamber body 120, and a substrate support assembly 130. For clarity, the chamber 100 has been cross-sectioned, and only the upper portion of chamber body 120 is illustrated in FIG. 1.

Lamp assembly 110 includes a plurality of lamps 111, each of which is positioned inside a reflective tube 112. The lamps 111 may be incandescent lamps, such as tungsten-halogen, or other high output lamps, such as discharge lamps. Together, the reflective tubes 112 form a honeycomb array 113 inside a water-cooled housing 114. In one example, a very thin window 115 forms the bottom surface of lamp assembly 110, separating lamp assembly 110 from the vacuum usually present in chamber 100. In another example, the window 115 is a separate element. The window 115 is generally made of any material resistant to the processing environment and transmissive to the selected radiation. For example, quartz is typically used for the window 115 since it is transparent to infrared light. Another suitable material includes, but is not limited to, sapphire. In further examples, the window 115 is optionally coated with an anti-reflective coating or any other suitable filters, on one or both sides of the window 115. For example, optional ultra-violet (UV) filters are used to avoid generation of ions and radicals in the chamber or damage to UV-sensitive structures on the substrate, if the lamps 111 have significant UV output. As another example, optional notch filters are used to restrict narrow band radiation. Lamp assembly 110 is attached to the upper surface of chamber body 120 in a vacuum-tight manner.

Chamber body 120 includes the walls and floor of chamber 100 as well as a substrate opening 121 and exhaust opening 122. Substrates are delivered into and removed from chamber 100 through substrate opening 121, and a vacuum pump (not shown) evacuates chamber 100 through exhaust opening 122. Slit or gate valves (not shown) may be used to seal substrate opening 121 and exhaust opening 122 when necessary.

The substrate support assembly 130, which defines a processing plane, is contained inside chamber body 120 and includes an edge support 131, a rotatable member 132 disposed in contact with the edge support 131, a reflector plate 133, and an array of photo probes 134 (e.g., optical fibers). Edge support 131 rests on rotatable member 132. Rotatable member 132 is generally any suitable size and shape, and is made of a heat resistant material. In one example, the rotatable member 132 is a quartz cylinder. During substrate processing, edge support 131 supports the substrate (not shown for clarity) a distance below window 115. Rotatable member 132 rotates between about 50 rotations per minute (rpm) and about 300 rpm during substrate processing to maximize substrate temperature uniformity during processing by minimizing the effect of thermal asymmetries in chamber 100 on the substrate. Reflector plate 133 is positioned a distance beneath the substrate. Photo probes 134 penetrate partly or completely through reflector plate 133 and are directed toward a backside of the substrate during thermal processing. Photo probes 134 transmit radiant energy received from the substrate to one or more detectors 137, which may be pyrometers, for determining substrate temperature. When lamps 111 are incandescent lamps, the pyrometers are typically adapted to measure broadband emissions from the backside of the substrate in a selected range of wavelengths (e.g., between wavelengths of about 200 nm to about 5000 nm). The one or more detectors 137 may detect radiation emitted by the substrate and/or radiation transmitted by the substrate.

Each of the one or more detectors 137 can be any suitable photodetector. In one example, a detector 137 includes a filter that provides a spectral response sensitive to the wavelength of the absorption gap at the substrate temperatures between about 100° C. and about 350° C. The particular photodetector used therein may be a silicon photodetector for temperatures below about 350° C., since the absorption gap of silicon varies from about 1,000 nm to about 1,200 nm for temperatures from room temperature to 350° C. A silicon photodetector may be insensitive to radiation having a wavelength greater than about 1,100 nm. For temperatures higher than about 350° C., the absorption edge may be beyond the detection limits of the silicon photodetector, so any further increases in the absorption edge wavelength may not be readily detected.

The chamber 100 also includes a radiation source 150 disposed opposite at least one of the one or more detectors 137. The radiation source 150 is generally a pulsed radiation source, examples of which are described below.

As shown in FIG. 1, in one example, the chamber 100 optionally includes a beam splitter 141 in optical communication with the radiation emitted by the pulsed radiation source 150. In operation, the beam splitter 141 directs radiation from the pulsed radiation source 150 to a sampling detector 139, which is used to detect source modulation directly from the pulsed radiation source 150. The sampling detector 139 can help to compensate for any pulse-to-pulse modulation or other amplitude modulation. The beam splitter 141 typically has a low reflectance ratio, for example less than or equal to about 30%, such as about 20%, to avoid over-attenuating the radiation from the radiation source 150. In one example, the beam splitter 141 is a fiber coupled splitter, which is connected to the sampling detector 139 through a fiber. In FIG. 1, the beam splitter 141 is shown outside of the chamber body 120; however, the beam splitter 141 may also be positioned inside of the chamber 100 and not fiber-coupled to the radiation source 150, for example, inside the processing region, to detect the radiation emitted from the radiation source 150.

Figure 2A:
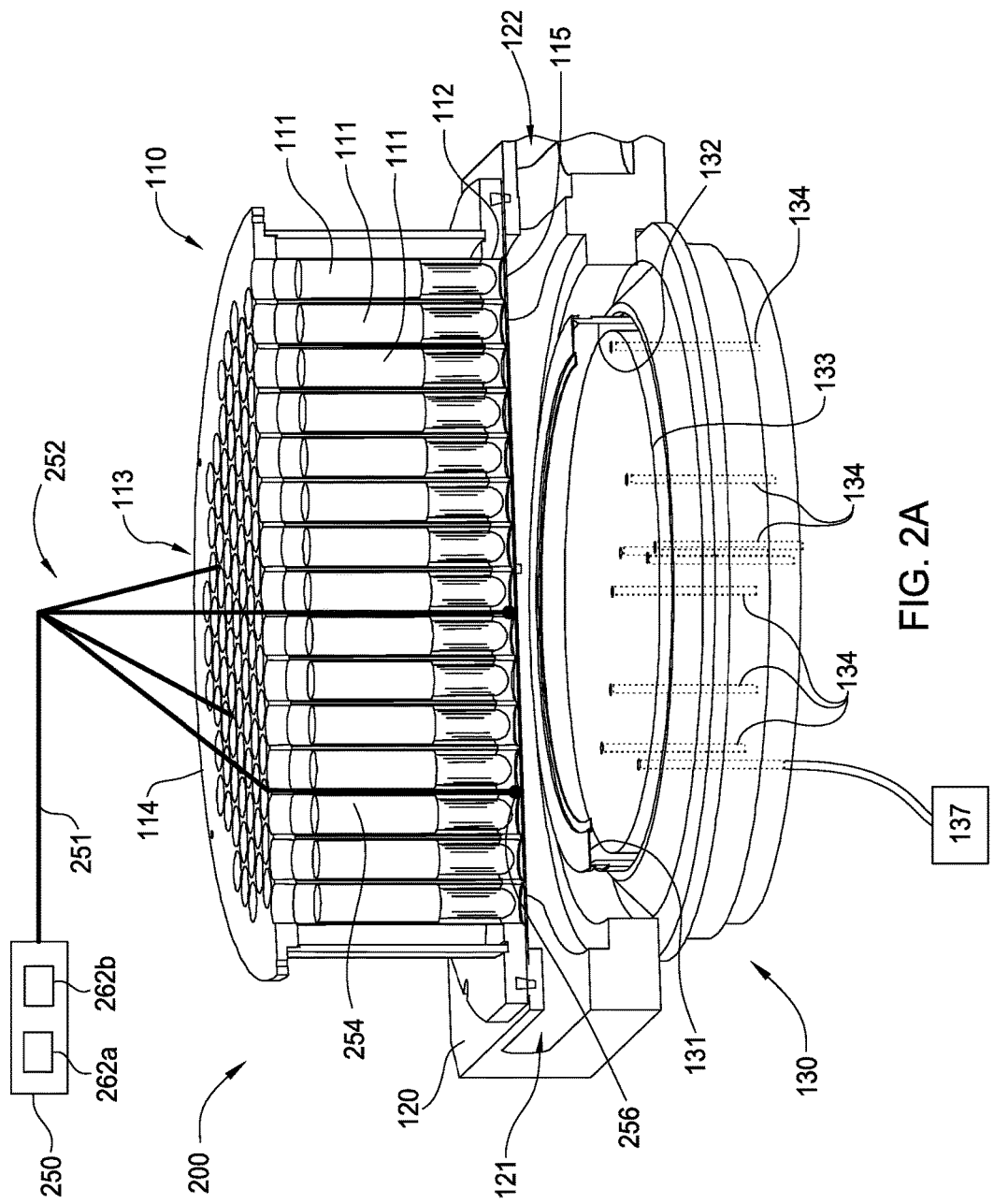
FIG. 2A is a partial perspective diagram of an RTP chamber having a radiation source including two or more lasers according to one example of the present disclosure.

FIG. 2A is a partial perspective diagram of an RTP chamber 200 according to one example of the present disclosure. The chamber 200 is similar to the chamber 100; however, the chamber 200 includes a pulsed laser radiation source 250. The chamber 200 generally includes a lamp assembly 110, a chamber body 120, and a substrate support assembly 130.

As illustrated, the radiation source 250 is coupled to the chamber body 120. For clarity, the radiation source 250 is shown as being located outside of the chamber body 120; however, it is also contemplated that the radiation source 250 may be located inside the chamber body 120. In one example, the radiation source 250 comprises a plurality of mounts coupled to or mounted directly on the lamp assembly 110. In other examples, which are contemplated by the present disclosure, the radiation source 250 is located inside of the lamp assembly 110, attached to the lamp assembly 110, immediately outside of the lamp assembly 110, or positioned at another suitable location. The radiation source 250 generates radiation for input to source manifold 252. The radiation emitted by the radiation source 250 generally travels through the source manifold 252, or splitter, to an incident area of a receiving surface of a substrate in the chamber 200.

Figure 2B:
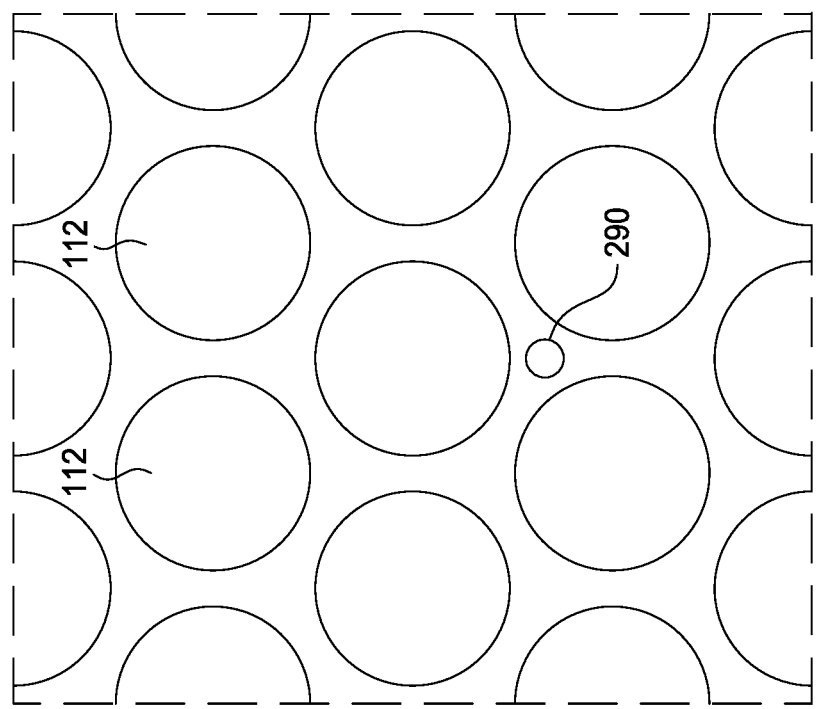
FIG. 2B is a top down view of a portion of the honeycomb array inside the lamp housing of the RTP chamber of FIG. 2A.

In one example, the source manifold 252 includes a plurality of beam guides 254, or optical fibers, disposed through openings 290 through interstitial spaces between the lamps 111 in the lamp assembly 110, as shown in FIG. 2B. As discussed above, the lamps 111 positioned inside the tubes 112 form a honeycomb array 113. The honeycomb array 113 configuration allows for the lamps 111 positioned inside the tubes 112 to be more tightly packed and closer together. The lamps 111 inside the tubes 112 run vertically or perpendicular to the upper surface of the water-cooled housing 114. Vertical interstitial spaces are formed within the honeycomb array 113 between the tubes 112. The openings 290 are drilled in the upper surface of the water-cooled housing 114 and run vertically through the interstitial spaces parallel to the tubes 112 having the lamps 111 therein. In one example, the openings 290 run further vertically through the window 115. A diameter of each of the openings 290 is greater than or equal to the diameter of each of the plurality of beam guides 254 such that the beam guides 254 may pass through the openings 290 to emit radiation to an incident surface of the substrate. In a further example, each of the plurality of beam guides 254 includes a collimating end surface or lens 256. The collimating end surface or lens 256 generally directs the radiation onto an incident area of the receiving surface of the substrate.

The radiation source 250 generally includes two or more pulsed lasers 262. The two or more pulsed lasers 262 are generally high-powered lasers emitting at various wavelengths used from transmission pyrometry. In one example, the two or more lasers 262 are supercontinuum lasers, which have low divergence, and are unpolarized, turn-key, and pulsed source.

As shown in FIG. 2A, the radiation source 250 includes two lasers 262, a first laser 262a and a second laser 262b. In one example, one of the first and second lasers 262a, 262b emits pulses of radiation in bands centered respectively at 1,030 nanometers (nm), and the other of the first and second lasers 262a, 262b emits pulses of radiation in bands centered respectively at 1,080 nm. The 1,030 nm laser operates at a nominal output of about 250 milliwatts (mW) and the 1,080 nm laser operates at a nominal output of about 450 mW. The pulses emitted from the first laser 262a and the second laser 262b are generally coupled into at least one fiber 251, which passes the pulses into the source manifold, or splitter, such as a 2×4 splitter, which splits the pulses into the plurality of beam guides, or optical fibers, 254, each of which culminates with one of the collimating end surfaces or lenses 256 at a distal (from the single fiber 251) end thereof. The at least one fiber 251 couples the radiation source 250 to the plurality of beam guides 254. In an example in which the pulses from the lasers 262 are split among four beam guides, or optical fibers, 254, losses from optics total about 60%, so each fiber outputs about 10% of the total nominal output of each laser, in pulses at the respective wavelength bands of the lasers 262.

While FIG. 2A illustrates two lasers 262, the radiation source 250 generally includes any suitable number of lasers 262, for example, three or more lasers 262. In one example, the radiation source 250 includes a third laser, which emits pulses of radiation in bands centered at a higher wavelength, for example, 1,120 nm. By using two or more supercontinuum lasers, two of which are at wavelengths of 1,030 nm and 1,080 nm, as described above, low to high temperatures can be measured and graphed, since the 1,080 nm laser can measure temperatures below about 200 degrees Celsius (° C.). Additionally, supercontinuum lasers have low temporal coherence and high spatial coherence.

The chamber 200 also includes one or more photo probes 134 aligned to the one or more beam guides, or optical fibers 254 to detect radiation transmitted from the radiation source 250. The chamber 200 also includes one or more detectors 137 optically coupled to the radiation source 250 and disposed opposite from the radiation source across the processing plane, which is generally any suitable detector for measuring radiation as a function of direction or wavelength. In addition to the one or more detectors 137, or alternatively, in some examples, the chamber 200 includes an indium gallium arsenide (InGaAs) Spectrometer or an InGaAs linear array with Near Infrared (NIR) Transmission grating for detection power as a function of wavelength at higher powers, for example, powers higher than about 1100 nm.

Figure 3:
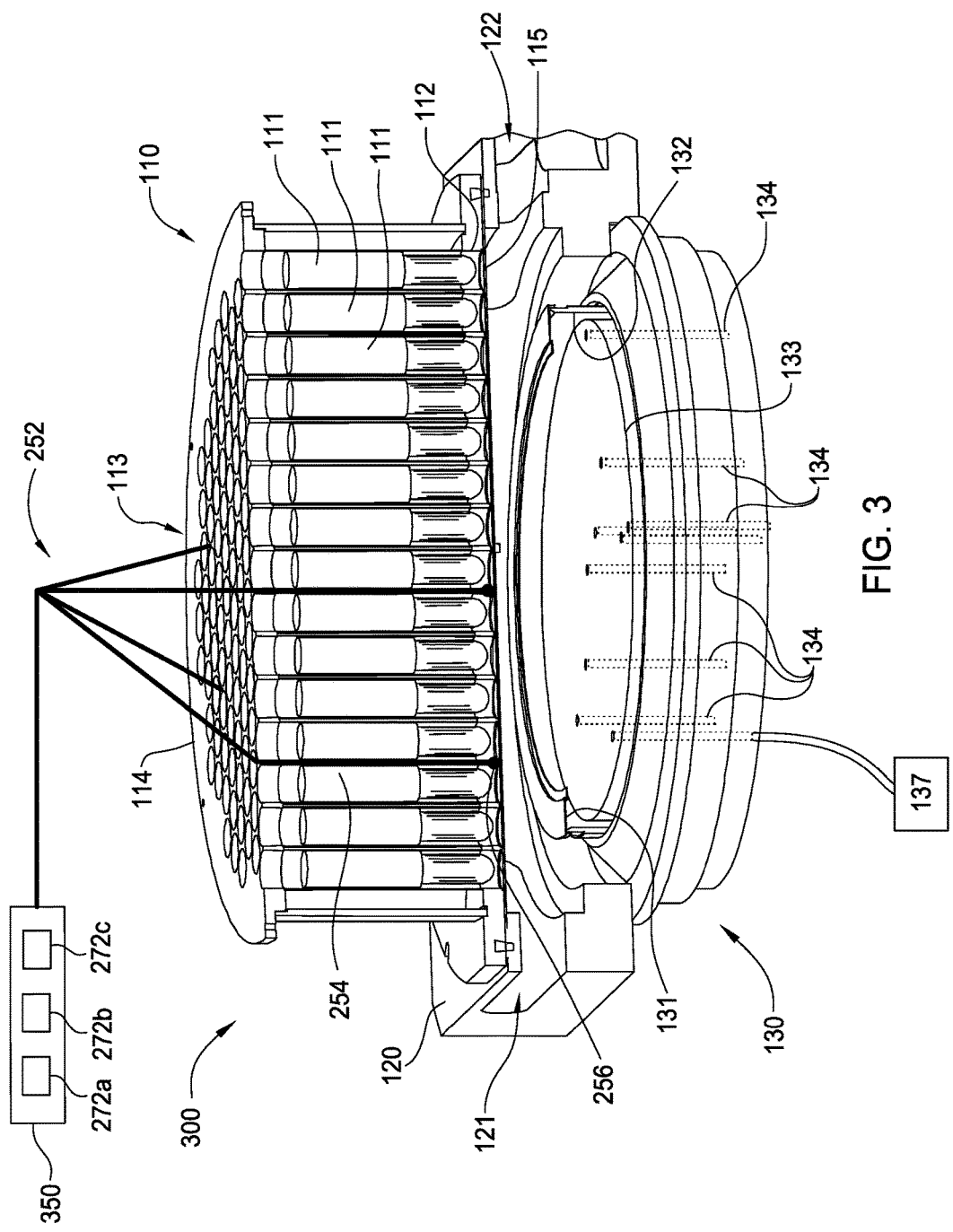
FIG. 3 is a partial perspective diagram of an RTP chamber having a radiation source including two or more SLEDs according to another example of the present disclosure.

FIG. 3 is a partial perspective diagram of an RTP chamber 300 according to one example of the present disclosure. The chamber 300 is similar to chamber 200; however, the chamber 300 also includes a radiation source 350 having two or more light emitting diodes (LEDs) 372. The chamber 300 generally includes the lamp assembly 110, the chamber body 120, and the substrate support assembly 130.

Like the radiation source 250, the radiation source 350 is generally coupled to the chamber body 120. For clarity, the radiation source 350 is shown as being located outside of the chamber body 120; however, it is also contemplated that the radiation source 350 may be located inside the chamber body 120. In other examples, which are contemplated by the present disclosure, the radiation source 350 is located inside of the lamp assembly 110, attached to the lamp assembly 110, immediately outside of the lamp assembly 110, or positioned at another suitable location. Also like the radiation source 250, the radiation source 350 generates radiation for input to source manifold 252. The radiation emitted by the radiation source 350 generally travels through the source manifold 252, or splitter, to an incident area of a receiving surface of a substrate in the chamber 300. In one example, the source manifold 252 includes a plurality of beam guides 254, or optical fibers, dispersed through openings 290 between the lamps 111 in the lamp assembly 110, as shown in FIG. 2B. In a further example, each of the plurality of beam guides 254 includes a collimating end surface or lens 256. The collimating end surface or lens 256 generally directs the radiation onto an incident area of the receiving surface of the substrate.

The radiation source 350 generally includes two or more LEDs 372, such as superluminescent diodes (SLEDs or SLDs). SLEDs are similar to lasers, but do not include front and back mirrors. As shown in FIG. 3, the radiation source 350 includes three SLEDs 372, a first SLED 372a, a second SLED 372b, and a third SLED 372c. The first SLED 372a emits pulses of radiation in bands centered at a first wavelength, for example, 1,030 nm or any other suitable wavelength. The second SLED 372b emits pulses of radiation in bands centered at a second wavelength, for example, 1,080 nm or any other suitable wavelength. The third SLED 372c emits pulses of radiation in bands centered at a third wavelength, which is generally any suitable wavelength for transmission pyromtery.

By using two or more SLEDs 372, two of which are at wavelengths of 1,030 nm and 1,080 nm, as described above, low to high temperatures can be measured and graphed, since the 1,080 nm SLED can measure temperatures below about 200 degrees Celsius (° C.). A relatively small number of SLEDs can cover a broad wavelength range, which is useful in transmission pyrometry. Additionally, the SLEDs 372 are spatially coherent and have a relatively low cost.

The chamber 300 also includes one or more of the photo probes 134 aligned to the one or more beam guides, or optical fibers, 254 to detect radiation transmitted from the radiation source 350. The chamber 300 also includes one or more detectors 137 optically coupled to the radiation source 250 and disposed opposite from the radiation source across the processing plane, which is generally any suitable detector for measuring radiation as a function of direction or wavelength. In addition to the one or more detectors 137, or alternatively, in some examples, particularly when the SLEDs have broad bandwidths, the chamber 300 includes an indium gallium arsenide (InGaAs) Spectrometer.

Figure 4:
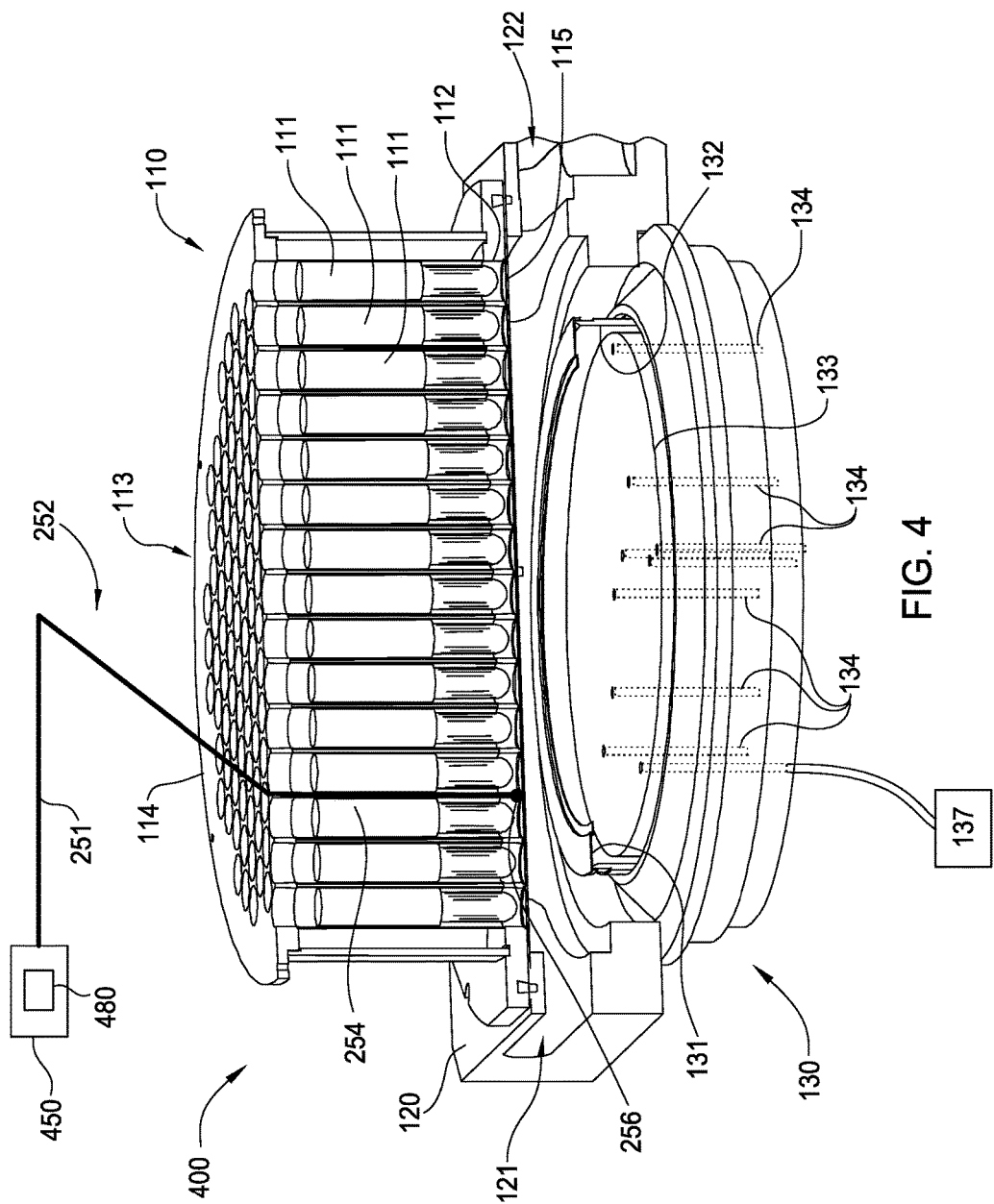
FIG. 4 is a partial perspective diagram of an RTP chamber having a radiation source including at least one broadband source according to yet another example of the present disclosure.

FIG. 4 is a partial perspective diagram of an RTP chamber 400 according to one example of the present disclosure. The chamber 400 is similar to chamber 200 and chamber 300; however, the chamber 400 includes a radiation source 450 having a single broadband source 480. The chamber 400 generally includes a lamp assembly 110, a chamber body 120, and a substrate support assembly 130.

Like radiation sources 350 and 350, the radiation source 450 is coupled to the chamber body 120. For clarity, the radiation source 250 is shown as being located outside of the chamber body 120; however, it is also contemplated that the radiation source 250 may be located inside the chamber body 120. In one example, the radiation source 450 comprises a laser or LED mount coupled to or mounted directly on the lamp assembly 110. In other examples, which are contemplated by the present disclosure, the radiation source 450 is located inside of the lamp assembly 110, attached to the lamp assembly 110, immediately outside of the lamp assembly 110, or positioned at another suitable location. The radiation source 450 generates radiation for input to source manifold 452. The radiation emitted by the radiation source 450 generally travels through the source manifold 452 to an incident area of a receiving surface of a substrate in the chamber 400. In one example, the source manifold 452 includes a beam guide 454, or optical fiber, dispersed through an opening 290 between the lamps 111 in the lamp assembly 110, as shown in FIG. 2B. In a further example, the beam guide 454 includes a collimating end surface or lens 256. The collimating end surface or lens 256 generally directs the radiation onto an incident area of the receiving surface of the substrate.

In one example, the radiation source 450 includes the single broadband source 480. In one example, the single broadband source 480 is a supercontiuum laser capable of emitting pulses of radiation over a broad continuum of wavelengths useful in transmission pyrometry. In another example, the broadband source 480 is a broadband LED, for example, a white LED, which is capable of emitting pulses of radiation over a broad continuum of wavelengths useful in transmission pyrometry.

In further examples, the radiation source 450 is another continuum source, including but not limited to, incandescent sources, halogen incandescent sources, and discharge lamps which are generally chopped and optionally filtered to provide a pulsed source.

By using a broadband source capable of emitting pulses of radiation with a broad spectrum of wavelengths, two of which are at wavelengths of 1,030 nm and 1,080 nm, as described above, low to high temperatures can be measured and graphed, since the 1,080 nm radiation can be used to measure temperatures below about 200 degrees Celsius (° C.).

Further examples of the radiation source 250, the radiation source 350, and the radiation source 450 include, but are not limited to, any solid state pulsed sources, chopped incandescent sources, halogen incandescent sources, and discharge lamps, which emit pulses of radiation at various frequencies between about 1,020 nm and about 1,090 nm, for example, 1,030 nm and 1,080 nm.

In operation, the radiation source 150, 250, 350, and/or 450 and the one or more detectors 137 are generally used for thermal sensing methods to measure temperature using pulsed radiation. As discussed above each of the examples of the radiation sources 150, 250, 350, and 450 are operable to emit radiation at least at two wavelengths, 1,030 nm and 1,080 nm.

Figure 5:
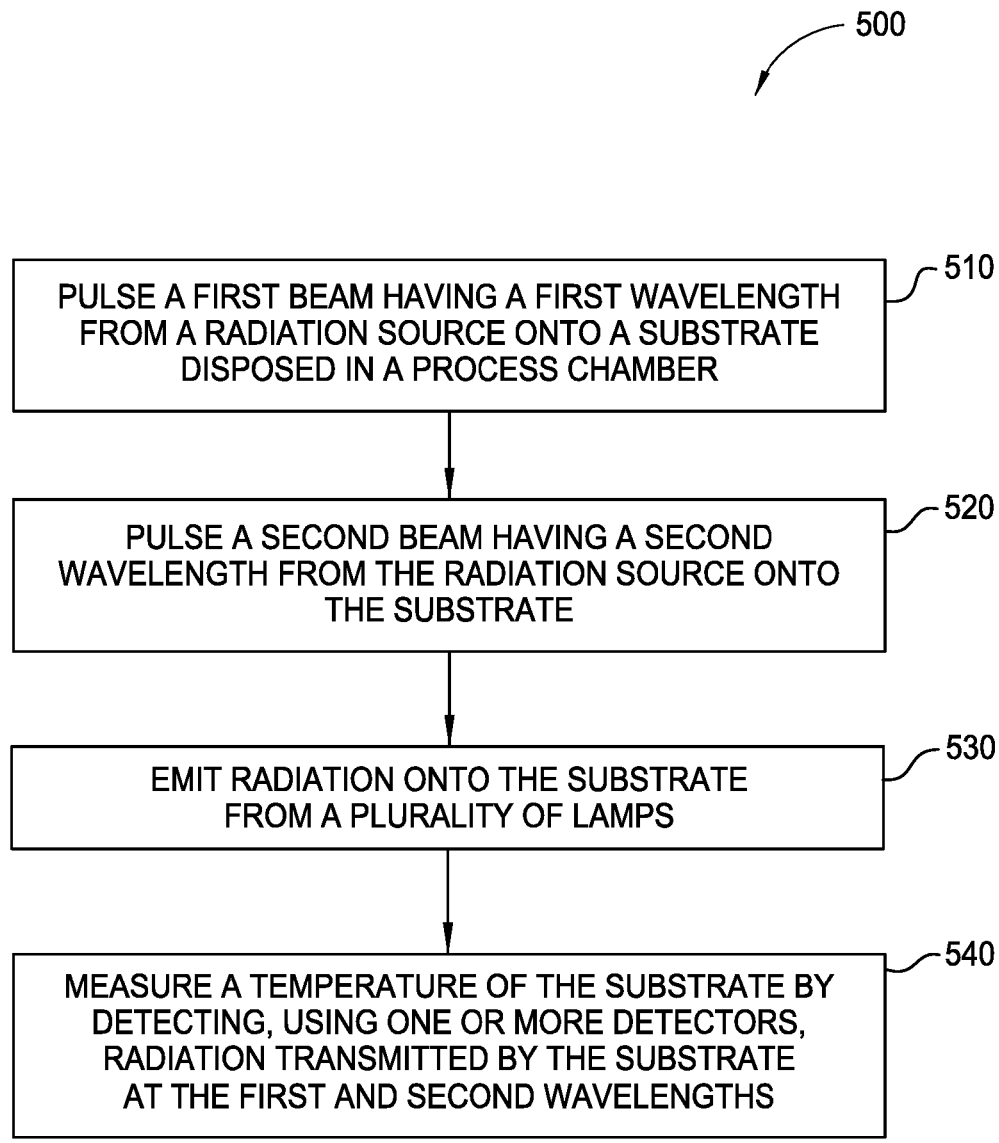
FIG. 5 illustrates a flow diagram of a temperature measurement method according to examples of the present disclosure.

FIG. 5 illustrates a flow diagram of a temperature measurement method 500 according to examples of the present disclosure. The method 500 begins at operation 510 by pulsing a first beam having a first wavelength onto a substrate disposed in a process chamber. At operation 520, a second beam having a second wavelength is pulsed onto the substrate. The first and second wavelengths are generally from 1,000 nm to 1,500 nm. In one example, the first wavelength is 1,030 nm and the second wavelength is 1,080 nm. In another example, the first wavelength is 1,080 nm and the second wavelength is 1,030 nm. In one example, the 1,030 nm laser operates at a nominal output of about 250 mW and the 1,080 nm laser operates at a nominal output of about 450 mW.

The pulsing of the first beam and the pulsing of the second beam can be done by any suitable pulsing method. In one example, power can be pulsed from a power supply to the radiation source 150, 250, 350, and/or 450 using a wave generator and/or a timing circuit. In another example, a wave generator is used for amplitude modulation pulsing of the power to the radiation source 150, 250, 350, and/or 450. In another example, shutters are used for pulsing down to a certain pulse length. In another example, one or more optical switches are incorporated into the lasers or LEDs of the radiation source 150, 250, 350, and/or 450 and the beam guides 254. In another example, one or more structures for turning opaque to light when a voltage is applied may be used for the pulsing. In another example, one or more Pockels cells are paired with a polaroid filter, for example, to accomplish fast (e.g., in the single nanosecond range) switching on and off. In yet another example, Q-switching, which allows the generation of energetic pulses with energies of millijoules or more, durations typically in the nanosecond range, and repetition rates between a few hertz and many kilohertz, is used for inherently pulsing lasers.

At operation 530, radiation is emitted onto the substrate from the plurality of lamps 111. The emission of radiation from the plurality of lamps 111 generally occurs during, intermittently with, prior to, or after the pulsing operations 510 and 520. In one example, the emission of radiation from the plurality of lamps 111 is concurrent with the pulsing of the first beam having a first wavelength and the pulsing of the second beam having the second wavelength. At operation 540, a temperature of the substrate is measured by the one or more detectors 137.

The one or more detectors 137 are configured to measure the radiation transmitted by one or more of the radiation sources 150, 250, 350, and/or 450. The one or more detectors 137 are optionally calibrated by pulsing radiation through a substrate at a known temperature and recording the spectrum transmitted through the substrate. After calibrating, in one example, a reading is obtained from a target within the chamber 100 after one pulse to get a temperature. In another example, a reading is obtained after each of a plurality of pulses; the readings are then averaged and temperature determined from the average reading. In yet another example, readings and temperatures are obtained after each of the plurality of pulses, and the temperatures are then averaged to determine the substrate temperature. In further examples, the method includes pre-recording chamber noise in the one or more detectors 137, for example by supplying power to the lamps 111 at various levels and recording corresponding readings of the one or more detectors 137. A noise component can then be interpolated from any lamp power level and the noise component can be subtracted from readings of the one or more detectors 137 to achieve more accurate temperature measurement. In one example, full-on/full-off pulsing of the one or more of the radiation sources 150, 250, 350, and/or 450 is used. In another example, amplitude modulation pulsing of the one or more of the radiation sources 150, 250, 350, and/or 450 is used. With multiple radiation sources, a mixture of full-on/full-off and amplitude modulation can be used. The pulsing of the one or more of the radiation sources 150, 250, 350, and/or 450 can be synchronized with wafer rotation to read from the same position on the substrate, or various patterns of pulsing can be used to obtain readings from various positions on the substrate. In one example, the pulsing frequency is selected to enhance discrimination from radiation transmitted by a heating source.

In some examples using pulsed radiation sources, background radiation is measured while the laser, or other pulsed radiation source, is off and the background signature is subtracted from the detected radiation when the laser is on to get a true transmission signal since the radiation emitted from the plurality of lamps can also have a wavelength from about 1,020 nm to about 1,090 nm, which can be background radiation to the radiation emitted from the one or more radiation sources when detected by one or more detectors. In order to improve on the accuracy of the measurement of the substrate from low to high temperatures, the one or more detectors records radiation when the one or more radiation sources is on and when the one or more radiation sources is off. The signal obtained by the one or more detectors when the one or more radiation sources is off is subtracted from the signal obtained by the one or more detectors when the one or more radiation sources is on, and the resulting signal (i.e., temperature) is a more accurate measurement of the temperature of the substrate. Because the radiation from the one or more radiation sources is pulsed, the background radiation can be recorded and subtracted from the measurement when the one or more radiation sources are on.

In another example, background noise in the chamber is reduced or eliminated using an integral transform technique, such as Fast Fourier Transform (FFT), to remove frequency contributions associated with noise. Types of noise that may be eliminated include, but are not limited to, photonic noise, electronic noise, and/or electromagnetic noise.

The radiation source 250, the radiation source 350, and the radiation source 450 are discussed separately above; however, the present disclosure also contemplates any combination of the variety of radiation sources, including lasers, LEDs, and broadband sources for transmission pyrometry to measure and graph low to high temperatures.

Benefits of the present disclosure include temperature measurement along a broad range of temperatures from low to high. Once measured, the temperatures are generally graphed to illustrate the temperature on the substrate surface over time, which is beneficial to substrate manufacturing processes.

While the foregoing is directed to examples of the present disclosure, other and further examples of the disclosure may be devised without departing from the basic scope thereof, and the scope thereof is determined by the claims that follow.

What is claimed is:
1. A thermal processing chamber comprising:
 a chamber body;
 a lamp assembly coupled to the chamber body;
 a substrate support assembly coupled to the chamber body opposite the lamp assembly, the substrate support assembly defining a processing plane;
 a pulsed radiation source coupled to the lamp assembly, the pulsed radiation source comprising:
  a first laser operable to emit radiation at a first wavelength;
  a second laser operable to emit radiation at a second wavelength; and
  a third laser operable to emit radiation at a third wavelength, wherein the third wavelength is 1,120 nanometers;
 a source manifold that couples the pulsed radiation source to the lamp assembly; and a radiation detector optically coupled to the pulsed radiation source and disposed opposite from the pulsed radiation source across the processing plane.

2. The chamber of claim 1, wherein the first wavelength is 1,030 nanometers, and wherein the second wavelength is 1,080 nanometers.

3. The chamber of claim 1, wherein the source manifold comprises:
at least one fiber; and
a plurality of beam guides, the at least one fiber coupling the pulsed radiation source to the plurality of beam guides, each beam guide having a collimating end surface at a distal end thereof.

4. The chamber of claim 3, wherein the lamp assembly comprises a plurality of lamps arranged in a honeycomb array.

5. The chamber of claim 4, wherein each of the plurality of lamps is disposed in one of a plurality of tubes, the plurality of tubes having a plurality of interstitial spaces therebetween, and a plurality of openings, wherein each of the plurality of openings is disposed over one of the interstitial spaces, each of the openings having a diameter greater than or equal to a diameter of each of the plurality of beam guides.

6. The chamber of claim 1, wherein the radiation detector comprises at least one of an indium gallium arsenide spectrometer and a silicon detector.

7. The chamber of claim 6, wherein the indium gallium arsenide spectrometer comprises an indium gallium arsenide linear array with Near Infrared (NIR) Transmission grating.

8. The chamber of claim 1, wherein the first laser operates at a nominal output of about 250 milliwatts.

9. The chamber of claim 1, wherein the second laser operates at a nominal output of about 450 milliwatts.

10. A thermal processing chamber comprising:
a chamber body;
a lamp assembly coupled to the chamber body;
a substrate support assembly coupled to the chamber body opposite the lamp assembly, the substrate support assembly defining a processing plane;
a pulsed radiation source coupled to the lamp assembly, the pulsed radiation source comprising:
a first superluminescent diode operable to emit radiation at a first wavelength;
a second superluminescent diode operable to emit radiation at a second wavelength; and
a third superluminescent diode operable to emit radiation at a third wavelength of 1,120 nanometers;
a source manifold that couples the pulsed radiation source to the lamp assembly; and
a radiation detector optically coupled to the pulsed radiation source and disposed opposite from the pulsed radiation source across the processing plane.

11. The chamber of claim 10, wherein the first wavelength is 1,030 nanometers, and wherein the second wavelength is 1,080 nanometers.

12. The chamber of claim 10, wherein the radiation detector further comprises an indium gallium arsenide spectrometer.

13. The chamber of claim 12, wherein the indium gallium arsenide spectrometer comprises an indium gallium arsenide linear array with Near Infrared (NIR) Transmission grating.

14. The chamber of claim 10, wherein the source manifold further comprises:
at least one fiber; and
a plurality of beam guides, the at least one fiber coupling the pulsed radiation source to the plurality of beam guides, each beam guide having a collimating end surface at a distal end thereof.

15. The chamber of claim 14, wherein the lamp assembly further comprises a plurality of lamps, each of the plurality of lamps being disposed in one of a plurality of tubes, the plurality of tubes having a plurality of interstitial spaces therebetween, and a plurality of openings, wherein each of the plurality of openings is disposed over one of the interstitial spaces, each of the openings having a diameter greater than or equal to a diameter of each of the plurality of beam guides.

* * * * *